United States Patent [19]

Hirose et al.

[11] Patent Number: 5,481,070
[45] Date of Patent: Jan. 2, 1996

[54] DIRECT CURRENT OIL-FILLED SELF CONTAINED CABLE

[75] Inventors: Masayuki Hirose; Ryosuke Hata; Yoshiteru Nakaura, all of Osaka, Japan

[73] Assignee: Sumitomo Electric Industries, Ltd., Osaka, Japan

[21] Appl. No.: 199,276

[22] PCT Filed: Jun. 28, 1993

[86] PCT No.: PCT/JP93/00872

§ 371 Date: Feb. 25, 1994

§ 102(e) Date: Feb. 25, 1994

[87] PCT Pub. No.: WO94/00853

PCT Pub. Date: Jun. 26, 1994

[30] Foreign Application Priority Data

Jun. 26, 1992 [JP] Japan .................... 4-193285

[51] Int. Cl.$^6$ .................... H01B 7/02; H01B 9/06
[52] U.S. Cl. .................... 174/120 FP; 174/25 R; 174/120 SC
[58] Field of Search .................... 174/120 FP, 120 SC, 174/24, 25 R

[56] References Cited

U.S. PATENT DOCUMENTS

| | | | |
|---|---|---|---|
| 3,749,812 | 7/1973 | Reynolds et al. | 174/25 R |
| 4,329,536 | 5/1982 | Sato et al. | 174/25 C |
| 4,602,121 | 7/1988 | Priaroggia | 174/25 R |
| 4,859,804 | 8/1989 | Hata et al. | 174/25 R |
| 4,994,632 | 2/1991 | Bosisio et al. | 174/121 R |

FOREIGN PATENT DOCUMENTS

| | | | |
|---|---|---|---|
| 56153028 | 4/1955 | Japan . | |
| 56153029 | 4/1955 | Japan . | |
| 22589 | 2/1979 | Japan | 174/25 R |
| 60482 | 5/1979 | Japan | 174/25 R |
| 58-100314 | 6/1983 | Japan . | |
| 62-24887 | 5/1987 | Japan . | |
| 1-30245 | 6/1989 | Japan . | |
| 1-26006 | 8/1989 | Japan . | |

Primary Examiner—Morris H. Nimmo
Attorney, Agent, or Firm—Wenderoth, Lind & Ponack

[57] ABSTRACT

A DC OF cable has its main insulation composed of a composite insulation tape comprising a low dielectric loss film and kraft paper (PPLP). 1–10 sheets of kraft paper are wound on the PPLP main insulation as a layer on the inside and/or the outside thereof.

15 Claims, 1 Drawing Sheet

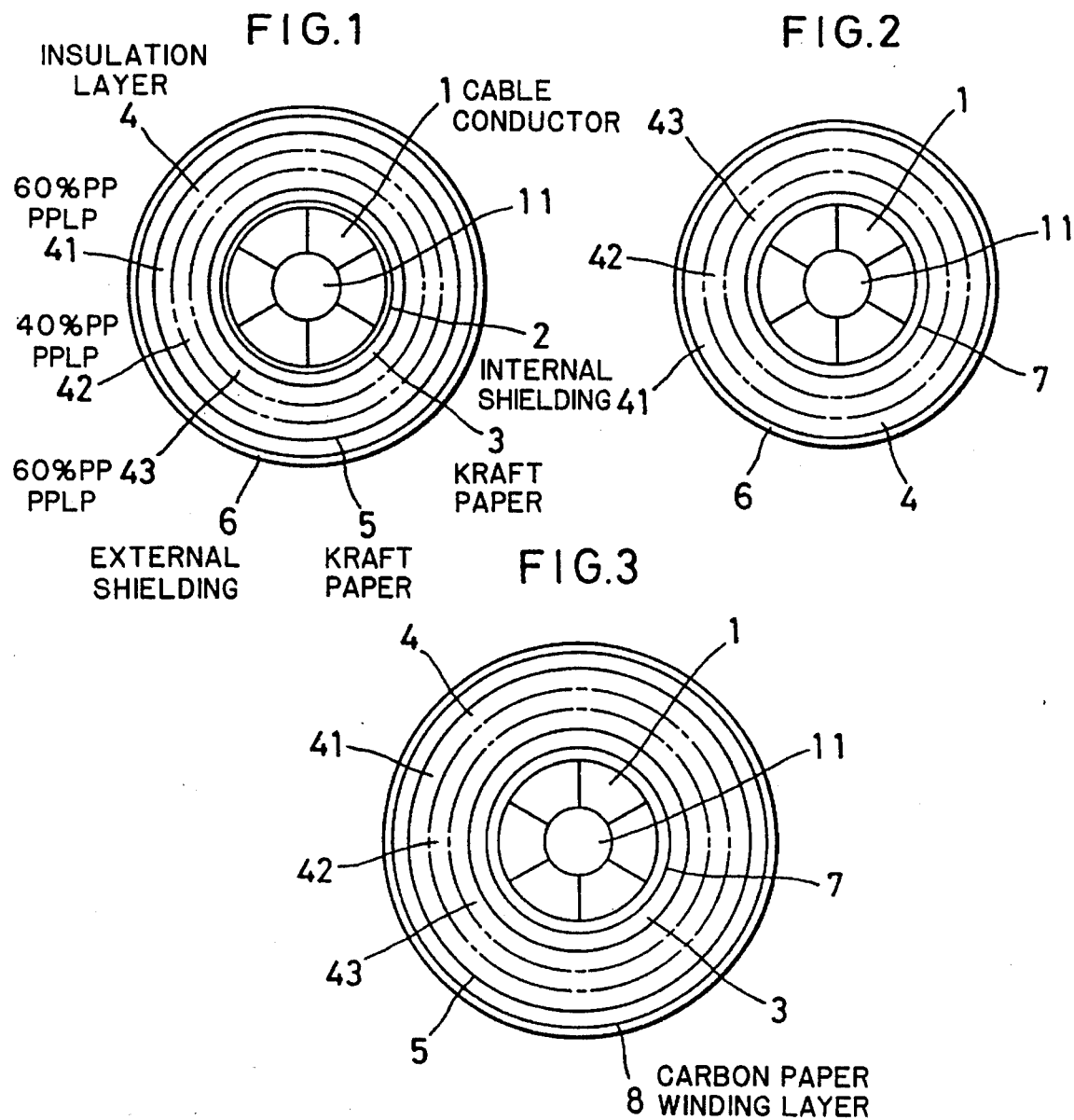
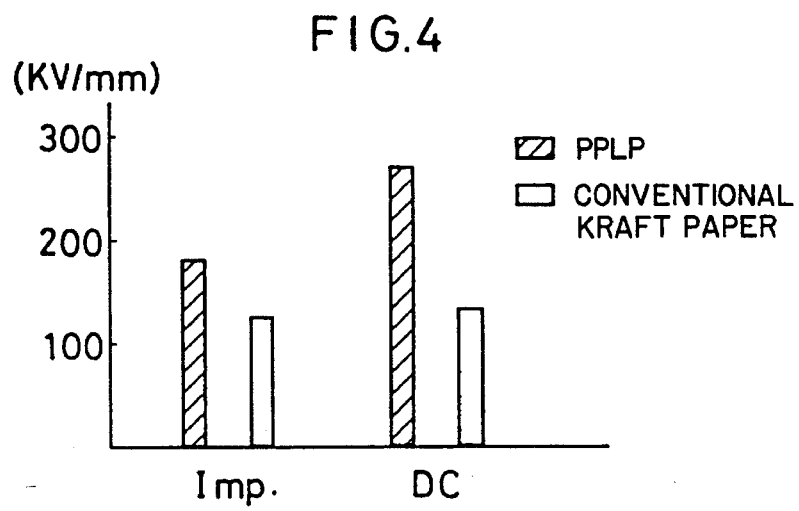

5,481,070

DIRECT CURRENT OIL-FILLED SELF CONTAINED CABLE

TECHNICAL FIELD

The present invention relates to a direct current (hereinafter abbreviated to DC) oil-filled self contained (hereinafter abbreviated to OF) cable used as a long power cable, particularly a long distance submarine power cable, for large electric power transmission.

PRIOR ART

Heretofore, oil immersed solid power cables, or mass-impregnated non-draining (MIND) cables and OF cables have been adaptable as DC cables. In the case of DC OF cables, kraft paper with high impermeability and which is excellent in breakdown strength is often used, because such dielectric characteristics as permittivity or dielectric tangent are, unlike alternating current (hereinafter abbreviated to AC) cables, not significant to DC cables. They are otherwise not much different from AC cables in basic structure.

DC Cables must have (1) sufficient DC withstanding characteristics, (2) sufficient withstanding characteristics against such abnormal voltages as lightening surges etc. and (3) sufficient withstanding characteristics against polarity reversal and, moreover, must satisfy the required carrying capacity.

DC stress distribution in insulation is determined by the $\rho$-characteristic of the insulation. This $\rho$-characteristic in turn varies with temperature and stress. It undergoes a complex change, as the temperature distribution in the insulation changes.

As far as the conventional DC cables in use with the kraft paper insulation are concerned, the DC stress distribution determined by the aforementioned $\rho$ characteristic is not the prominent factor of their design, but these cables have rather been designed on the basis of impulse design as with AC cables, and more particularly on the basis of the electric stress which will develop when an impulse with opposite polarity superposed onto DC is applied on the conductor.

For discussions on DC cables for large electric power transmission, not only is impulse strength required, as in AC cables, but DC withstand-voltage strength is required as well. In this case, evaluating the necessary thickness of the insulation would generally result in a large thickness, detracting from ensuring the required transmission capacity. As a countermeasure, the conductor resistance may be reduced by increasing the conductor size, to cut down its current loss, thereby ensuring the transmission capacity. But this approach would involve productivity reduction, cable size increase, cost rise and other various problems.

DISCLOSURE OF THE INVENTION

Against this background, the present invention provides a DC OF cable in which the above described problems have been solved, Its first characteristic feature lies in that its main insulation is composed of a composite insulation tape (hereinafter abbreviated to PPLP) formed by laminating a low dielectric loss plastic film and kraft paper, that $\rho$-grading is applied by combining therewith another or other PPLP(s) differing in plastic film ratio, as required, and that 1–10 sheets or layers of kraft paper are wound on the aforementioned PPLP main insulation to arrange its layer(s) on the inside and/or outside thereof.

Its second characteristic feature is that its main insulation is composed of PPLP, that $\rho$-grading is applied by combining therewith another or other PPLP(s) differing in plastic film ratio, as required, and that 3–5 sheets or layers of carbon paper are wound on the aforementioned PPLP main insulation to arrange its layer(s) on the inside and/or outside thereof.

Further, its third characteristic feature lies in that its main insulation is composed of PPLP, that $\rho$-grading is applied by combining therewith another or other PPLP(S) differing in plastic film ratio, as required, that 3–5 sheets or layers of carbon paper are wound at least just onto the conductor, and that 1–10 sheets or layers of kraft paper are wound on the PPLP insulation to arrange its layer(s) on the inside and/or outside thereof.

BRIEF DESCRIPTION OF THE DRAWINGS

FIG. 1 is a cross-sectional view of an insulation configuration of a DC OF cable embodying this invention;

FIG. 2 is a cross-sectional view of an insulation configuration of another DC OF cable embodying this invention;

FIG. 3 is a cross-sectional view of an insulation configuration of still another DC OF cable embodying this invention; and FIG. 4 is a DC characteristic comparison between PPLP and conventional kraft paper.

DETAILED DESCRIPTION OF THE INVENTION

The present invention provides a DC OF cable in which its main insulation is composed of a composite tape formed by laminating a low dielectric loss plastic film and kraft paper, and 1–10 sheets of kraft paper are wound on the aforementioned composite tape main insulator to arrange its layer(s) on the inside and/or outside thereof.

The PPLP commonly applied to AC cables is a composite insulation formed by integrally laminating low dielectric loss polyolefinic film, for example, polypropylene film (designated as PP) and kraft paper(s), is one that gives low dielectric loss as well as high dielectric strength and that has superior impulse characteristic to kraft paper.

The DC characteristic of this PPLP is confirmed to be very excellent, as shown in FIG. 4. As a measure for improvement in the DC characteristic of kraft paper, increasing its impermeability is mentioned. PPLP has an impermeability such as is equivalent to infinity. Because as the PP ratio in PPLP grows larger, its impulse and DC characteristics are enhanced, it becomes possible to form an optimal $\rho$-distribution ($\rho$-grading) through the optimization of the $\rho$-distribution and stress in each part of the insulation by combining appropriate PPLP layer(s) which are composed of PPLP with different PP ratios.

Application examples are as follows: The measure is not always one in view of conductor size and cable load (transmission current). The DC stress is high on the conductor side at normal temperature, but it is high on the sheath side at high temperatures. On this account, a PPLP having high dielectric strength, such as one with an approx. 60% PP ratio, i.e. a ratio of the content of polypropylene film to the PPLP as a whole of 60%, is arranged on the conductor side of the main insulation and on the sheath side of the main insulation, where stress is high, and a PPLP with an approx. 40% PP ratio is arranged intermediate therebetween. In the case where an evenly averaged stress is optimal, PPLP with an approx. 40% PP ratio is arranged on the conductor side and on the sheath side, and PPLP with an approx. 60% PP ratio is arranged intermediate therebetween.

As hereinabove described, where the DC stress distribution is concerned, stress is high on the conductor side at normal temperature but on the sheath side at high temperatures. Generally, as for the strength of insulation, the thinner the insulating tape, the higher its withstand-voltage strength. Accordingly, by arranging thin insulating tapes on the conductor side and the sheath side, it is possible to respond to the stress distribution peculiar to DC cables as mentioned above mentioned and design a cable capable of withstanding AC surge.

Next, as for impulse characteristic of PPLP, as shown in Table 1, PPLP gives rather large polarity differences between (+) and (−). This can be considered to stem from the PP film contained in PPLP.

TABLE 1

| Item | PPLP | DC Cellulose paper |
|---|---|---|
| Thickness (μm) | 125 | 125 |
| Film ratio (%) | approx. 50 | — |
| ε | 2.8 | 4.0 |
| tanδ (%) | 0.08 | 0.33 |
| $\rho_o$ (Ω · cm) | $4 \times 10^{19}$ | $6 \times 10^{18}$ |
| α (1/°C.) | 0.07 | 0.10 |
| β (mm/kV) | 0.11 | 0.045 |
| Breakdown strength (kV/mm) | | |
| AC | 53(80) | 44 |
| Imp+ | 114(140) | 115 |
| Imp− | 156(209) | |
| DC+ | 149(211) | 134 |
| DC− | 136(232) | |

As a result of assiduous research, we discovered a very useful fact. When a few sheets of kraft paper are arranged on the (+) polarity side of PPLP, improvement will be effected in the direction of diminishing polarity difference. Further, improvement was found to be achieved by arranging 3–5 sheets of carbon papers there with about $10^3$–$10^6$ Ω.cm.

It was found out as a result of evaluations pursued on a variety of configurations that use of 3 or more sheets, or preferably 7–10 sheets, of approx. 100 μm kraft paper with a 1000 Gurley sec or higher of impermeability and 3–5 sheets of carbon paper of about $10^3$–$10^6$ Ω.cm is recommended and that a configuration of conductor-carbon paper(s)-kraft paper(s)-PPLP(s) kraft paper(s)-carbon paper(s)-metal sheath is generally most preferable for DC OF cables. However, use of still more sheets of carbon paper and kraft paper will result in thicker insulation, raising problems in insurance of permissible current and economy. Therefore, a still larger number of sheets should be avoided.

Further, in connection with the countermeasure against (+) polarity impulse problem, since the stress on the conductor side grows severer with increasing conductor size (for example, to 600 mm$^2$ or larger) and insulation thickness (for example, to 10 mm or larger), a configuration of conductor-carbon paper(s)-kraft paper(s)-PPLP(s)-metal sheath, that is, the aforementioned configuration with kraft paper(s) and/or carbon paper(s) omitted on the sheath side where less stress is involved, is also practical.

PREFERRED EMBODIMENTS OF THE INVENTION

FIG. 1 presents a cross-sectional view of a concrete example of the insulation configuration of a DC OF cable of this invention. Referring to this figure, reference numeral 1 denotes a cable conductor having an oil passage in its interior; 2, a usual internal shielding layer formed by winding the conductor with about 1–2 sheets of carbon paper; 3, a layer of 1–10 sheets of kraft paper wound thereabout; and 4, a PPLP insulation layer having, for example, a PPLP with an about 60% PP ratio wound on the cable conductor side 43 and the sheath side 41 and another PPLP with an about 40% PP ratio wound at an intermediate portion 42 therebetween, thereby providing a ρ grading. Numeral 5 designates 1–10 sheets of kraft paper wound on the outside of the PPLP insulation layer 4, to form its layer thereon, and 6 stands for a usual external shielding layer formed on the last mentioned layer by winding it with about 1–2 sheets of carbon paper.

FIG. 2 is a cross-sectional view of another concrete example of the insulation configuration of the DC OF cable of this invention. Referring to this figure, the same numbers represent the same parts. In this concrete example, in place of the usual internal shielding layer on the conductor 1, 3–5 sheets of carbon paper are wound thereabout to arrange a carbon paper winding layer 7; then a PPLP insulation layer 4, on which a ρ-grading similar to that of FIG. 1 is applied, is provided thereon; and further, a usual external shielding layer 6 is provided on top thereof. In this instance, in place of the external shielding layer 6, 3–5 sheets of carbon paper may be wound thereabout to arrange a carbon paper winding layer.

FIG. 3 is a sectional view of still another insulation configuration of the DC OF cable of this invention. In this figure, the same numerals identical to those in FIGS. 1 and 2 represent the same parts.

In this concrete example, on a cable conductor 1, 3–5 sheets of carbon paper are wound to form a carbon paper winding layer 7; 1–10 sheets of kraft paper are wound thereabout to arrange a kraft paper winding layer 3; and then a PPLP insulation layer 4 on which a ρ-grading is applied just as hereinabove described is provided thereon. On top of it, 1–10 sheets of kraft paper are wound to arrange a kraft paper winding layer 5 and further 3–5 sheets of carbon paper are wound thereabout to arrange a carbon paper winding layer 8. In this instance, in place of the carbon paper winding layer 8, for example, 1–2 sheets of carbon paper may be wound therearound to provide an external shielding layer.

EFFECT OF THE INVENTION

When large capacity transmission cables adapted for use at ±500 kV and 2800 A are designed using a DC OF cable of this invention as shown in FIG. 3 and a prior art DC OF cable configured with the use of kraft paper, they compare as shown in Table 2. Table 2 indicates that in the former, the cable outer diameter and weight can be reduced, conductor size decreased, cable cost reduced, and moreover, the installation work expense can be retrenched. Accordingly, its effects are quite enormous, when it is utilized as long distance submarine power cables for large electric power transmission.

TABLE 2

| Item | Unit | Prior art paper | PPLP |
| --- | --- | --- | --- |
| Size | mm² | 3500 | 3000 |
| Insulation thickness | mm | 25 | 20 |
| Outer Diameter | mm | 182 | 166 |
| Weight | kg/m | 101 | 86 |
| Cost | % | 100 | 98 |

What is claimed is:

1. A DC OF cable, comprising:

a cable conductor having an interior oil passage;

a main insulation surrounding said cable conductor, said main insulation comprising a composite tape that is composed of a low dielectric loss plastic film laminated with kraft paper; and a carbon winding layer comprising 3–5 sheets of carbon paper located at at least one of a first position inside said main insulation and outside of said cable conductor and a second position outside of said main insulation.

2. The DC OF cable of claim 1, wherein said low dielectric loss plastic film comprises polypropylene film, and the ratio of said polypropylene film in said main insulation varies according to the radial position of said composite tape relative to said cable conductor such that said main insulation is ρ-graded.

3. The DC OF cable of claim 2, wherein the ratio of polypropylene film in said main insulation is 60% at an inner radial position thereof adjacent to said cable conductor, 60% at an outer radial position thereof and 40% at a radial position thereof between said inner and outer radial positions.

4. The DC OF cable of claim 1, wherein said carbon winding layer is located at said first position as an internal shielding layer, with said 3–5 sheets of carbon paper being wound on said cable conductor.

5. The DC OF cable of claim 4, wherein a second said carbon winding layer comprising 3–5 sheets of carbon paper is provided at said second position, wound on said main insulation.

6. The DC OF cable of claim 4, wherein an external shielding layer of about 1–2 sheets of carbon paper is wound on said main insulation.

7. The DC OF of claim 4, wherein said main insulation is wound on said carbon winding layer.

8. The DC OF of claim 1, wherein said carbon winding layer is provided at said second position, wound on said main insulation.

9. A DC OF cable, comprising:

a cable conductor having an interior oil passage;

a main insulation surrounding said cable conductor, said main insulation comprising a composite tape that is composed of a low dielectric loss plastic film laminated with kraft paper;

a carbon winding layer comprising 3–5 sheets of carbon paper arranged on said cable conductor between said main insulation and said cable conductor; and a kraft paper winding layer comprising 1–10 sheets of kraft paper arranged at at least one of a first position inside said main insulation and outside of said cable conductor and a second position outside of said main insulation.

10. The DC OF cable of claim 9, wherein said low dielectric loss plastic film comprises polypropylene film, and the ratio of said polypropylene film in said main insulation varies according to the radial position of said composite tape relative to said cable conductor such that said main insulation is ρ-graded.

11. The DC OF cable of claim 10, wherein the ratio of polypropylene film in said main insulation is 60% at an inner radial position thereof adjacent to said cable conductor, 60% at an outer radial position thereof and 40% at a radial position thereof between said inner and outer radial positions.

12. The DC OF cable of claim 9, wherein said 3–5 sheets of carbon paper are wound on said cable conductor and said 1–10 sheets of kraft paper are wound on said carbon paper winding layer at said first position.

13. The DC OF cable of claim 12, wherein a second said kraft paper winding layer comprising 1–10 sheets of kraft paper is arranged at said second position, with said sheets of kraft paper of the second said kraft paper winding layer being wound on said main insulation.

14. The DC OF of claim 13, wherein a second carbon paper winding layer comprising 3–5 sheets of carbon paper is wound on the second said kraft paper winding layer.

15. The DC OF of claim 13, wherein an external shielding layer comprising 1–2 sheets of carbon paper is wound on the second said kraft paper winding layer.

* * * * *